US010886333B2

(12) United States Patent
Hekmatshoartabari et al.

(10) Patent No.: US 10,886,333 B2
(45) Date of Patent: Jan. 5, 2021

(54) MEMORY STRUCTURE INCLUDING GATE CONTROLLED THREE-TERMINAL METAL OXIDE COMPONENTS

(71) Applicant: International Business Machines Corporation, Armonk, NY (US)

(72) Inventors: Bahman Hekmatshoartabari, White Plains, NY (US); Alexander Reznicek, Troy, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/290,176

(22) Filed: Mar. 1, 2019

(65) Prior Publication Data
US 2020/0279888 A1    Sep. 3, 2020

(51) Int. Cl.
*H01L 27/24* (2006.01)
*H01L 45/00* (2006.01)
*G11C 13/00* (2006.01)

(52) U.S. Cl.
CPC ...... *H01L 27/2463* (2013.01); *G11C 13/0002* (2013.01); *H01L 45/1233* (2013.01); *H01L 45/146* (2013.01); *H01L 45/147* (2013.01); *H01L 45/1608* (2013.01); *H01L 45/1666* (2013.01); *G11C 2213/31* (2013.01); *G11C 2213/32* (2013.01); *G11C 2213/71* (2013.01)

(58) Field of Classification Search
None
See application file for complete search history.

(56) References Cited

U.S. PATENT DOCUMENTS

| 8,036,018 | B2 | 10/2011 | Koh et al. |
| 8,270,200 | B2 | 9/2012 | Wu et al. |
| 9,484,091 | B2 | 11/2016 | Takahashi et al. |
| 9,514,818 | B1 | 12/2016 | Roizin et al. |
| 2014/0138609 | A1* | 5/2014 | Satoh ............... H01L 27/11273 257/5 |

(Continued)

FOREIGN PATENT DOCUMENTS

WO    2012085627 A1    6/2012

OTHER PUBLICATIONS

E. Herrmann et al., "Gate Controlled Three-Terminal Metal Oxide Memristor," IEEE Electron Device Letters, Apr. 2018, vol. 39, No. 4.

(Continued)

*Primary Examiner* — Mounir S Amer
(74) *Attorney, Agent, or Firm* — Daniel Morris; Ryan, Mason & Lewis, LLP (57) ABSTRACT

A method for manufacturing a semiconductor memory device includes forming a plurality of source lines spaced apart from each other on a dielectric layer, forming a plurality of spacers on sides of the plurality of source lines, and forming a plurality of drain lines on the dielectric layer adjacent the plurality of source lines including the plurality of spacers formed thereon. In the method, a metal oxide layer is formed on the plurality of source lines and on the plurality of drain lines, and a plurality of gate lines are formed on the metal oxide layer. The plurality of gate lines are oriented perpendicular to the plurality of drain lines and the plurality of source lines.

16 Claims, 8 Drawing Sheets

(56) References Cited

U.S. PATENT DOCUMENTS

| | | | |
|---|---|---|---|
| 2014/0346612 A1* | 11/2014 | Adam | H01L 29/6653 257/397 |
| 2015/0325788 A1* | 11/2015 | Hashim | G11C 13/0069 438/382 |
| 2018/0166134 A1 | 6/2018 | Zidan et al. | |

OTHER PUBLICATIONS

Margaret Rouse, "What is Memristor?" https://whatis.techtarget.com/defnition/memristor, May 15, 2015, 4 pages.

* cited by examiner

MEMORY STRUCTURE INCLUDING GATE CONTROLLED THREE-TERMINAL METAL OXIDE COMPONENTS

BACKGROUND

Memory cells may include, for example, phase-change random-access memory (PCRAM), resistive random-access memory (RRAM or ReRAM), magnetic random-access memory (MRAM), and/or fuse/anti-fuse devices. RRAM devices have a three-layer structure of a top electrode, switching medium and bottom electrode.

Two terminal (2T) RRAM memristive devices including thin film metal oxides (MOs) have been used for non-volatile memory (NVM) applications, as well as in neuromorphic architectures. The 2T devices use the same terminals to read and configure a device by keeping the read voltage below a threshold to retain device state. This approach makes multiple state devices and continuous resistive-state (RS) tunable devices difficult to implement. Additionally, setting and resetting the 2T devices undesirably consumes relative large amounts of power.

Accordingly, there is a need for an improved RRAM memory structure which addresses the aforementioned difficulties associated with 2T devices.

SUMMARY

According to an exemplary embodiment of the present invention, a method for manufacturing a semiconductor memory device includes forming a plurality of source lines spaced apart from each other on a dielectric layer, forming a plurality of spacers on sides of the plurality of source lines, and forming a plurality of drain lines on the dielectric layer adjacent the plurality of source lines including the plurality of spacers formed thereon. In the method, a metal oxide layer is formed on the plurality of source lines and on the plurality of drain lines, and a plurality of gate lines are formed on the metal oxide layer. The plurality of gate lines are oriented perpendicular to the plurality of drain lines and the plurality of source lines.

According to an exemplary embodiment of the present invention, a semiconductor memory device includes a plurality of source lines disposed on a dielectric layer, wherein the plurality of source lines are spaced apart from each other, a plurality of spacers disposed on sides of the plurality of source lines, and a plurality of drain lines disposed on the dielectric layer adjacent the plurality of source lines including the plurality of spacers disposed thereon. A metal oxide layer is disposed on the plurality of source lines and on the plurality of drain lines, and a plurality of gate lines are disposed on the metal oxide layer. The plurality of gate lines are oriented perpendicular to the plurality of drain lines and the plurality of source lines.

According to an exemplary embodiment of the present invention, a method for manufacturing a semiconductor memory device includes forming a plurality of select lines spaced apart from each other on an inter-level dielectric (ILD) layer, forming a plurality of spacers on sides of the plurality of select lines, and forming a plurality of bitlines on the ILD layer adjacent the plurality of select lines including the plurality of spacers formed thereon. A metal oxide layer is formed on the plurality of select lines and on the plurality of bitlines, and a plurality of wordlines are formed on the metal oxide layer. The plurality of wordlines are oriented perpendicular to the plurality of bitlines and the plurality of select lines.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Exemplary embodiments of the invention will now be discussed in further detail with regard to semiconductor devices and methods of manufacturing same and, in particular, to techniques for forming and structures of memory elements comprising gate-controlled three-terminal (3T) metal-oxide memristors.

It is to be understood that the various layers and/or regions shown in the accompanying drawings are not drawn to scale, and that one or more layers and/or regions of a type commonly used in, for example, phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of a substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

RRAM devices according to one or more embodiments, are stacked in a three-dimensional (3D) cross-point configuration. As used herein, a "cross-point" structure includes a configuration of memory cells at the intersection of wordlines and bitlines. In the structure, each of the memory cells can be addressed individually, so that data can be written and read in small sizes. As used herein, a "3D cross-point" structure includes two or more stacked layers of cross-point memory structures. Storage in the RRAM devices is based on resistance changes in a stackable cross-gridded data access array.

As used herein, a "memristor" refers to is a non-volatile memory (NVM) component based on resistance switching. A memristor may control the flow of electrical current in a circuit and, in the absence of power, recall a previous resistive state through the memristor.

As used herein, "non-volatile memory (NVM)" or "non-volatile" refers to a type of computer memory that can retrieve stored information or a region which retains electrical properties (e.g., resistance) even after power is cycled off and on. The retention time of a non-volatile memory (i.e., the time period over which the stored information can be retained) may range from a few minutes to over 10 years. While traditional storage applications may require retention times of over 10 years, shorter retention times such as, for example, several minutes to a few hours may be beneficial in emerging applications such as neuromorphic computing.

In accordance with one or more embodiments, memory elements comprising gate-controlled 3T metal-oxide memristors are used to form dense cross-point memory structures. The cross-point memory structures can be stacked to form 3D cross-point memory structures.

Figure 1A:
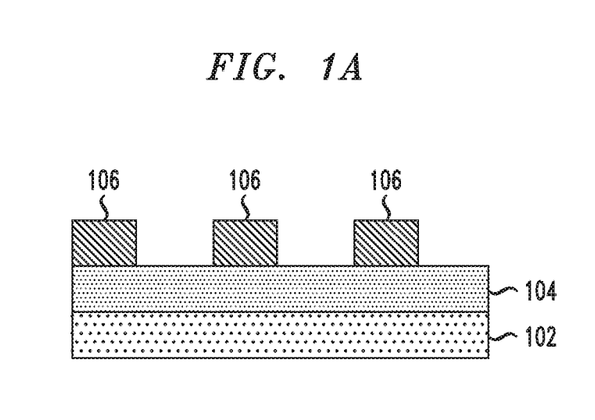
FIG. 1A is a schematic cross-sectional view and FIG. 1B is a schematic top view illustrating manufacturing of a memory device and showing formation of source lines on a dielectric layer, according to an embodiment of the invention.
Figure 1B:
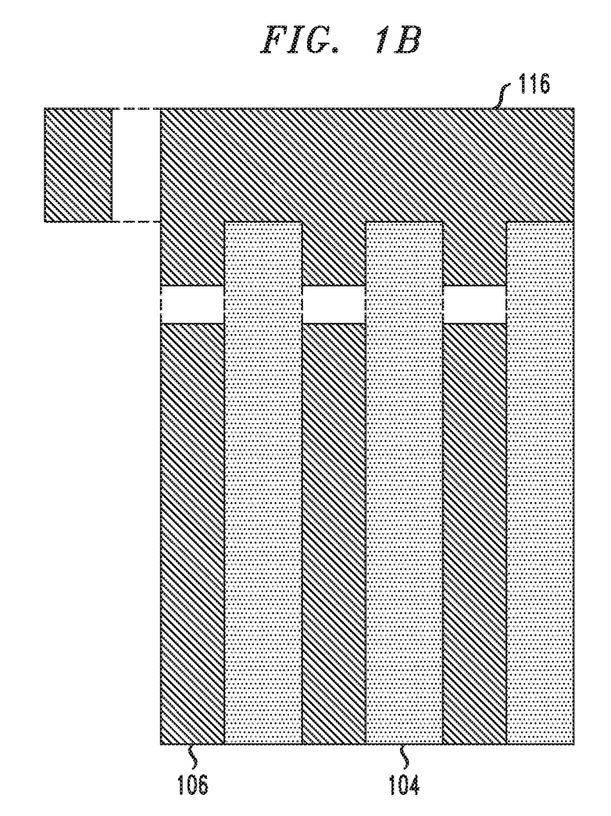

FIG. 1A is a schematic cross-sectional view and FIG. 1B is a schematic top view illustrating manufacturing of a memory device and showing formation of source lines on a dielectric layer, according to an embodiment of the invention. Referring to FIGS. 1A and 1B, a plurality of source lines 106 extending from a common source region 116 are formed on an inter-layer dielectric (ILD) layer 104.

The material of the ILD layer 104 can include, but is not necessarily limited to, a low-K dielectric material, such as, for example, silicon oxide, silicon nitride, silicon oxynitride, boron nitride, and/or silicon boron nitride. The ILD layer 104 is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, which may be followed by a planarization process, such as, chemical mechanical polishing (CMP), to remove excess portions of the ILD layer 104 after deposition.

As can be understood by one of ordinary skill in the art, the ILD layer 104 can be on a semiconductor substrate 102, with intervening layers between the ILD layer 104 and the substrate 102. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate 102, such as, for example, transistors, capacitors, and resistors. For example, the ILD layer 104 may be formed on a front end of a CMOS chip (e.g., front-end-of-line (FEOL)) or at a back-end-of-line (BEOL), where fabrication is performed at temperatures, for example, below or at ~400° C. to prevent damage to BEOL metal lines.

The material of the source lines 106 and the common source region 116 includes an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The source lines 106 and the common source region 116 can be deposited using, for example, CVD, PECVD, RFCVD, PVD, ALD, MLD, MBD, PLD, LSMCD, and/or sputtering, followed by planarization by, for example, CMP. The source lines 106 are patterned to be spaced apart from each other, using, for example, photolithography and reactive ion etching (RIE), which may optionally use a dielectric hard mask, including, for example, an oxide or nitride.

Referring to FIG. 1B, the dotted lines and empty spaces or breaks at portions along a length of the source lines 106 or a length of the common source region 116 illustrate that the source lines 106 and the common source region 116 can be longer than what is pictured, and the drawings are simplified for purposes of explanation. A width of the source lines 106 (horizontal direction in the drawings) may include, but is not limited to about 10 nm-about 50 nm. The number of source lines 106 shown in the figures is illustrative, and the embodiments are not necessarily limited to the number of source lines 106 shown. The source lines 106 form select-lines of a resulting memory cell array. In some embodiments, the common source region 116 is connected to a reference voltage (e.g., ground). In some embodiments, the select-lines can be accessed individually by the external circuitry, and the common source region 116 is omitted.

Figure 2A:
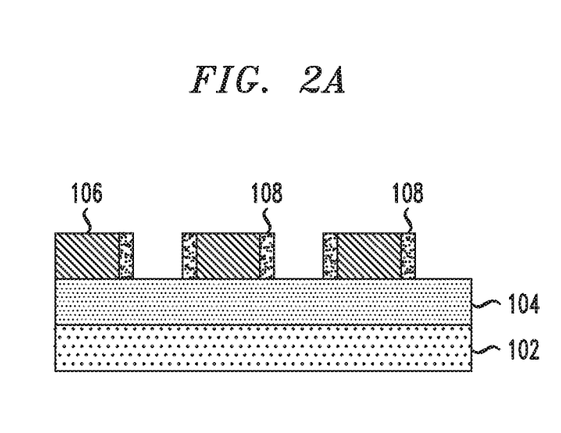
FIG. 2A is a schematic cross-sectional view and FIG. 2B is a schematic top view illustrating manufacturing of a memory device and showing spacer formation, according to an embodiment of the invention.
Figure 2B:
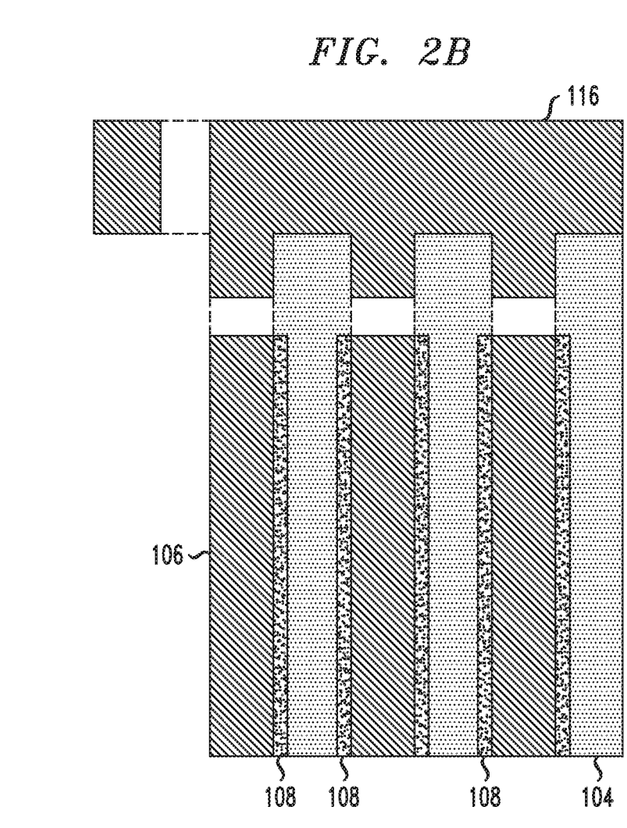

FIG. 2A is a schematic cross-sectional view and FIG. 2B is a schematic top view illustrating manufacturing of a memory device and showing spacer formation, according to an embodiment of the invention. Referring to FIGS. 2A and 2B, a spacer material, such as, for example, silicon nitride (SiN (e.g., $Si_3N_4$)), silicon boron nitride (SiBN), silicon carbon nitride (SiCN), silicon oxynitride (SiON), silicon-borocarbonitride (SiBCN), silicon oxycarbonitride (SiOCN) and/or other suitable dielectric material is conformally deposited on all exposed surfaces, including on sidewalls and top surfaces of the source lines 106 and on the ILD layer 104. The spacer material can be deposited using conformal deposition techniques, including, but not limited to, ALD or other conformal deposition process.

A directional etch using, example, ME, is performed to remove portions the spacer material from horizontal surfaces of the dielectric layer 104, and from top surfaces of the source lines 106 to result in the spacers 108 remaining on the vertical sidewalls of the source lines 106. A width of the spacers 108 (horizontal direction in the drawings) may include but is not limited to about 2 nm-about 20 nm. For example, a width of the spacers 108 can be about 3 nm, or another sub-lithographic dimension.

In accordance with an embodiment, prior to deposition of the spacer material, a mask is used to cover the common source region 116 and portions of the source lines 106 and ILD layer 104 adjacent the common source region 116, so that spacers are not formed on the areas covered by the mask. Alternatively, a mask is not used, and spacers are also formed on vertical sidewalls of the common source region 116 and/or portions of the source lines 106 adjacent the common source region. In accordance with another embodiment, a mask is not used but after the formation of the spacers, lithography and etching is used to remove the spacers from the vertical sidewalls of the common source region 116 and portions of the source lines 106 adjacent the common source region 116.

Figure 3A:
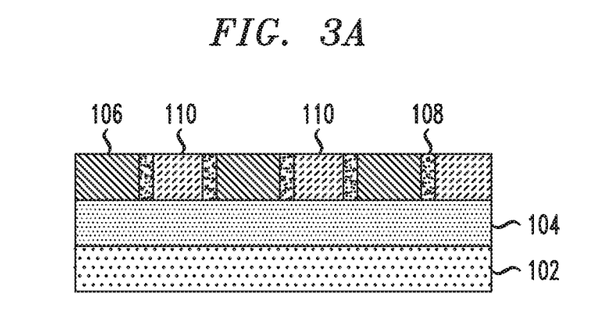
FIG. 3A is a schematic cross-sectional view and FIG. 3B is a schematic top view illustrating manufacturing of a memory device and showing formation of drain lines on a dielectric layer, according to an embodiment of the invention.
Figure 3B:
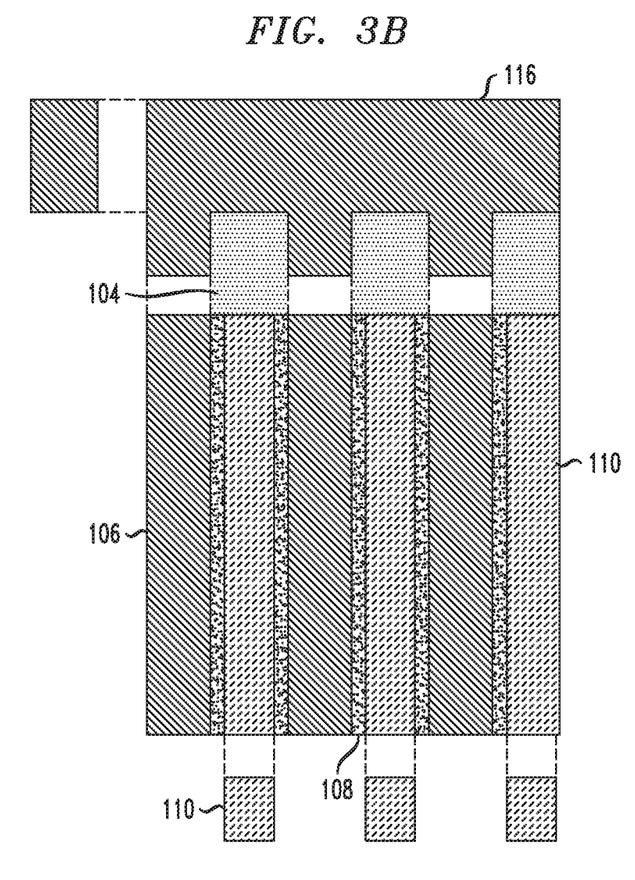

FIG. 3A is a schematic cross-sectional view and FIG. 3B is a schematic top view illustrating manufacturing of a memory device and showing formation of drain lines on a dielectric layer, according to an embodiment of the invention. Referring to FIGS. 3A and 3B, a plurality of drain lines 110 are formed on an inter-layer dielectric (ILD) layer 104. Similar to FIG. 1B, the dotted lines and empty spaces or breaks at portions along a length of the drain lines 110 in FIG. 3B illustrate that the drain lines 110 can be longer than what is pictured, and the drawings are simplified for purposes of explanation.

The material of the drain lines 110 includes an electrically conductive material the same or similar to that of the source lines 106, such as, but not necessarily limited to, the conductive metals, metal carbides, metal nitrides, transition metal aluminides or combinations thereof listed herein above. The drain lines 110 can be deposited on the ILD layer 104 to fill in the vacant areas between the spacers 108 and the source lines 106 using, for example, CVD, PECVD, RFCVD, PVD, ALD, MLD, MBD, PLD, LSMCD, and/or sputtering, followed by planarization by, for example, CMP. A width of the drain lines 110 (horizontal direction in the drawings) may include but is not limited to about 10 nm-about 50 nm. The drain lines 110 form bitlines of a resulting memory cell array. The number of drain lines 110 shown in the figures is illustrative, and the embodiments are not necessarily limited to the number of drain lines 110 shown. In some embodiments, the drain lines and source lines are comprised of different materials from each other, thus resulting in asymmetric source/drain memristors, whereas in other embodiments, the drain lines and source lines are comprised of the same material as each other, thus resulting in symmetric source/drain memristors. In some embodiments of an asymmetric source/drain memristor, changing the polarity of the voltage applied between source and drain alters the amplitude of current flow between source and drain, whereas in some embodiments of a symmetric source/drain memristor, changing the polarity of the voltage applied between source and drain does not alter the amplitude of current flow between source and drain. In some embodiments of an asymmetric source/drain memristor, changing the polarity of the voltage applied between source and drain results in a substantial change in the amplitude of current flow between source and drain. As such, applying a voltage across the drain terminals of two adjacent asymmetric source/drain memristors sharing a common source may result in substantially different voltage drops across the two memristors even if the two memristors have substantially the same channel conductance.

In accordance with an embodiment, prior to deposition of the drain lines 110, a mask is used to cover the common source region 116 and portions of the source lines 106 and ILD layer 104 adjacent the common source region 116, so that drain material is not formed on the areas covered by the mask.

Figure 4A:
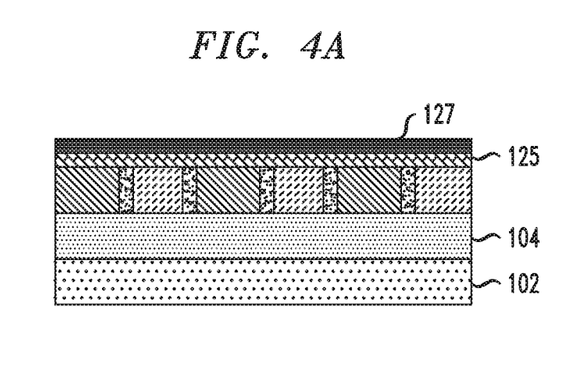
FIG. 4A is a schematic cross-sectional view and FIG. 4B is a schematic top view illustrating manufacturing of a memory device and showing deposition of metal oxide and dielectric layers, according to an embodiment of the invention.
Figure 4B:
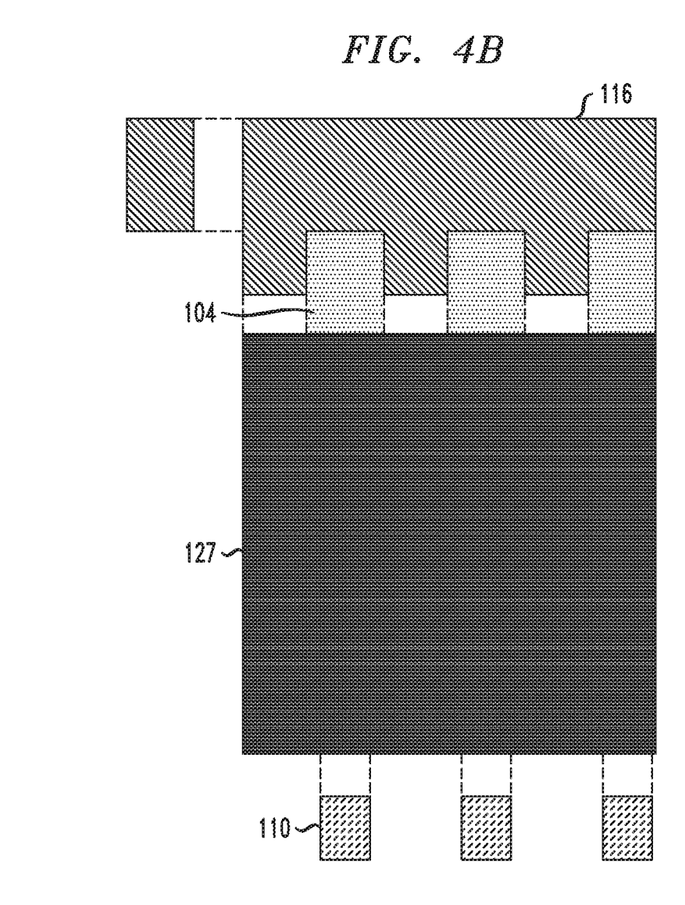

FIG. 4A is a schematic cross-sectional view and FIG. 4B is a schematic top view illustrating manufacturing of a memory device and showing deposition of metal oxide and dielectric layers, according to an embodiment of the invention. Referring to FIGS. 4A and 4B, stacked structure of a dielectric layer 127 on a metal oxide layer 125 is formed on portions of the source and drain lines 106 and 110 and the spacers 108. According to an embodiment, the dielectric and metal oxide layers 125 and 127 are formed on the portions of the source and drain lines on which the spacers 108 are formed.

The material of the metal oxide layer 125 includes, but is necessarily not limited to a perovskite or a transition metal oxide, such as, but not necessarily limited to, strontium titanate ($SrTiO_3$), zirconium titanate ($ZrTiO_3$), PCMO ($Pr_{0.7}Ca_{0.3}MnO_3$), nickel oxide (NiO), and/or titanium oxide ($TiO_2$). The material of the dielectric layer 127 includes, but is not necessarily limited to, SiN (e.g., $Si_3N_4$), SiBN, SiCN, SiON, SiBCN, SiOCN and/or other suitable dielectric material. The metal oxide layer 125 is deposited on the portions of the source and drain lines 106 and 110 and the spacers 108, and the dielectric layer 127 is deposited on the metal oxide layer 125 using, for example, CVD, PECVD, RFCVD, PVD, ALD, MLD, MBD, PLD, LSMCD, and/or sputtering. The deposition of the metal oxide and dielectric layers 125 and 127 may each be followed by planarization by, for example, CMP. A vertical thickness of the metal oxide layer 125 may include, but is not limited to about 2 nm-about 20 nm, and a vertical thickness for the dielectric layer 127 may include but is not limited to about 2 nm-about 10 nm. According to an embodiment, prior to deposition of the dielectric and metal oxide layers 125 and 127, a mask is used to cover the common source region 116, portions of the source lines 106 and ILD layer 104 adjacent the common source region 116 and end portions of the drain lines 110, so that the dielectric and metal oxide layers 125 and 127 are not formed on the areas covered by the mask. According to another embodiment, after the deposition of the dielectric and metal oxide layers 125 and 127, lithography and etching is used to remove the dielectric and metal oxide layers 125 and 127 from the common source region 116, portions of the source lines 106 and ILD layer 104 adjacent the common source region 116, and end portions of the drain lines 110.

As explained further herein below, the metal oxide layer 125 functions as a programmable non-volatile conductive channel layer between source and drain regions formed by the source and drain lines 108 and 110, and the dielectric layer 127 reduces leakage current between subsequently deposited gate lines 130 (see FIGS. 5A and 5B) and the metal oxide layer 125.

Figure 5A:
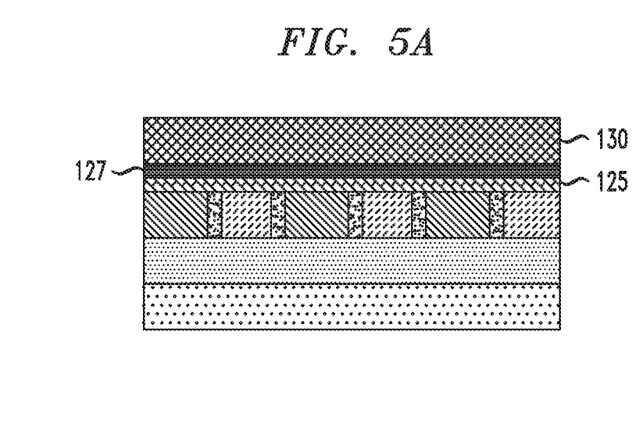
FIG. 5A is a schematic cross-sectional view and FIG. 5B is a schematic top view illustrating manufacturing of a memory device and showing deposition and patterning of gate lines, according to an embodiment of the invention.
Figure 5B:
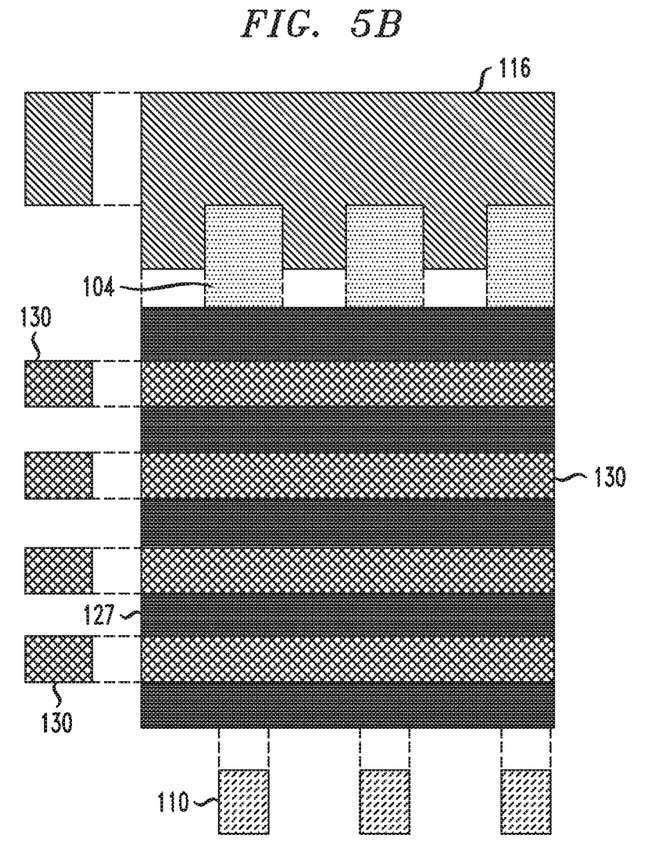

FIG. 5A is a schematic cross-sectional view and FIG. 5B is a schematic top view illustrating manufacturing of a memory device and showing deposition and patterning of gate lines, according to an embodiment of the invention. Referring to FIGS. 5A and 5B, plurality of gate lines 130 are formed on the dielectric layer 127 and are oriented perpendicular with respect to the source and drain lines 106 and 110, so that the gate lines 130 extend in a direction perpendicular to the extension direction of the source and drain lines 106 and 110. Similar to FIGS. 1B and 3B, the dotted lines and empty spaces or breaks at portions along a length of the gate lines 130 in FIG. 5B illustrate that the gate lines 130 can be longer than what is pictured, and the drawings are simplified for purposes of explanation.

The material of the gate lines 130 includes an electrically conductive material the same or similar to that of the source and drain lines 106 and 110, such as, but not necessarily limited to, the conductive metals, metal carbides, metal nitrides, transition metal aluminides or combinations thereof listed herein above. The gate lines 130 are deposited on the dielectric layer 127 using, for example, CVD, PECVD, RFCVD, PVD, ALD, MLD, MBD, PLD, LSMCD, and/or sputtering, followed by planarization by, for example, CMP. The gate lines 130 are patterned to be spaced apart from each other, using, for example, photolithography and ME, which may optionally use a dielectric hard mask, including, for example, an oxide or nitride. A width of the gate lines 130 (vertical direction in FIG. 5B) may include but is not limited to about 10 nm-about 50 nm. The gate lines 130 form wordlines of a resulting memory cell array. The number of gate lines 130 shown in the figures is illustrative, and the embodiments are not necessarily limited to the number of gate lines 130 shown.

In accordance with an embodiment, prior to deposition of the gate lines 130, a mask is used to cover the common source region 116, portions of the source lines 106 and ILD layer 104 adjacent the common source region 116 and end portions of the drain lines 110, so that the gate lines 130 are not formed on the areas covered by the mask.

As noted above, the dielectric layer 127 reduces current leakage between the gate lines 130 and the metal oxide layer 125. In accordance with an embodiment, the dielectric layer 127 is not used and the gate lines 130 are deposited directly on the metal oxide layer 125.

Figure 6A:
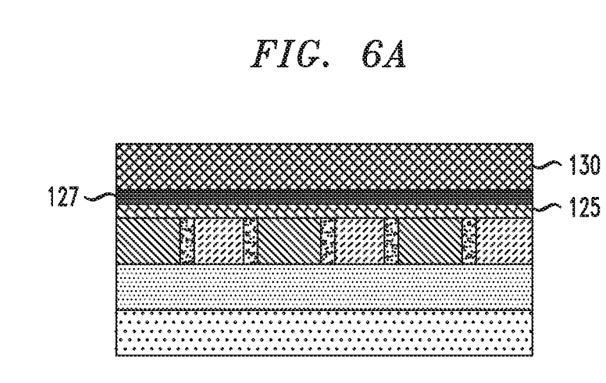
FIG. 6A is a schematic cross-sectional view and FIG. 6B is a schematic top view illustrating manufacturing of a memory device and showing patterning of the metal oxide and dielectric layers, according to an embodiment of the invention.
Figure 6B:
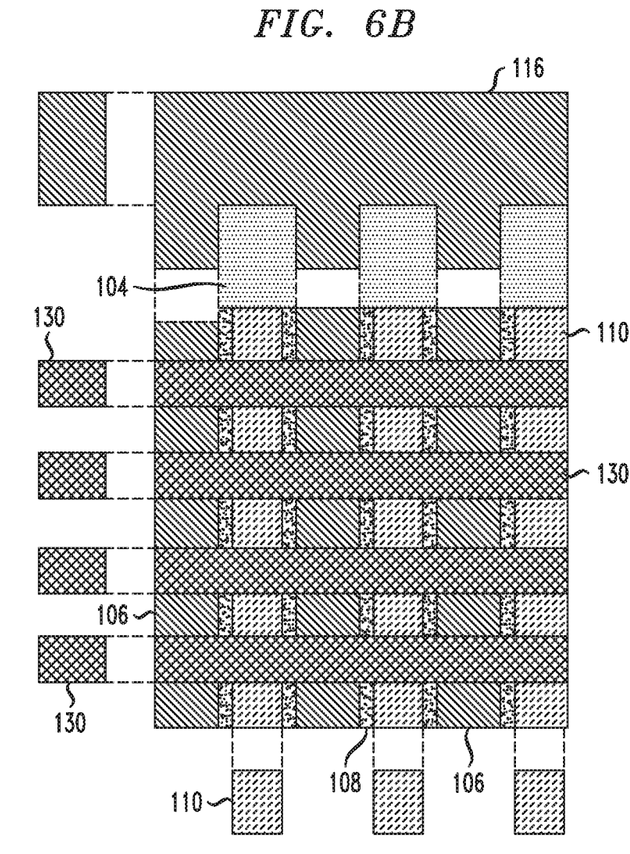

FIG. 6A is a schematic cross-sectional view and FIG. 6B is a schematic top view illustrating manufacturing of a memory device and showing patterning of the metal oxide and dielectric layers, according to an embodiment of the invention. Referring to FIGS. 6A and 6B, exposed portions of the dielectric layer 127 and metal oxide layer 125 (e.g., portions of the dielectric and metal oxide layers 127 and 125 not under the gate lines 130) are removed in order to isolate different gate lines 130 from each other and their corresponding memory cells of a memory cell array. The removal of the exposed portions of the dielectric layer 127 and underlying metal oxide layer 125 can be performed using an etching process, such as a dry etching process comprising, for example, $CF_4/O_2$, $CHF_3$, $CHF_3/Ar$, $BCl_3$, or a combination thereof.

In accordance with an embodiment, the removal of the dielectric and metal oxide layers 127 and 125 is optional. However, in the case of a large array (e.g., thousands or millions of memory cells), the removal of the dielectric layer 127 and underlying metal oxide layer 125 may be preferred. As noted herein above, the removal of the exposed portions of the dielectric layer 127 and underlying metal oxide layer 125 isolates different gate lines 130 from each other and their corresponding memory cells. The isolation reduces current leakage and cross-talk between the memory cells.

According to one or more embodiments, the source lines 106, the spacers 108, the drain lines 110, the metal oxide layer 125 and the gate lines 130 are parts of a memory cell array comprising a plurality of memory cells, where each memory cell of the plurality of memory cells comprises a three-terminal memristor, with a source terminal, a drain terminal and a gate terminal.

According to one or more embodiments, the plurality of memory cells are formed in a 3D cross-point structure. In the structure, each of the memory cells includes a 3T structure comprising a source region (e.g., portion of a source line 106) separated from a drain region (e.g., portion of a drain line 110) by a dielectric layer (e.g., a spacer 108), and a gate region (e.g., portion of a gate line 130). A metal oxide layer (e.g., layer 125) is positioned between the gate region and the source and drain regions, and functions as a programmable channel layer. A non-volatile conduction region, which is a portion of the metal oxide layer (e.g. layer 125), has a channel length approximately equal to a width of the dielectric layer (e.g., spacer 108), and is formed between each source and drain region. A non-volatile conduction region is formed in the metal oxide layer at least in part by applying a voltage to the gate. The non-volatile conduction region may be removed at least in part by applying a different voltage (e.g. of opposite polarity) to the gate. In one or more embodiments, the formation of the non-volatile conduction region is at least in part due to the accumulation of oxygen vacancies induced by the gate electric field. In some embodiments, the conduction region is at least in part due to the accumulation of metal ions or other charge carriers. The write and erase voltages may be in the range of about 1 volt-about 5 volts, but lower and higher voltages may be used as well. The respective portions of the metal oxide layer are respective non-volatile conduction regions of a plurality of memory elements in a memory cell array. The formation and removal of the conduction regions correspond to write and erase operations. In one or more embodiments, the read operation is performed by applying a read voltage between drain and source (via the corresponding bit-line and the select-line) and measuring the resulting current flow by external circuitry (e.g., a sense amplifier). If the conductive region is present (i.e., the memory is in the ON state), a relatively high current flow is measured by the external circuitry. In contrast, when the conductive region is absent (i.e., the memory is in the OFF state), a relatively low current flow is measured by the external circuitry. The state of the memory cell can thus be determined by the external circuitry depending on the amount of current flow. In one or more embodiments, the read voltages are in the range of about 1 volt-about 5 volts.

In order to form the 3D cross-point structure, configurations such as that shown in FIGS. 6A and 6B are stacked on each other. For example, after formation of an ILD layer on the structure shown in FIGS. 6A and 6B, the fabrication process described with respect to FIGS. 1A through 6B may be repeated to form a second cross-point structure stacked on the first cross-point structure. Each resistive memory element in a memory cell of the array including the 3T configuration can be referred to as a memristor.

Figure 7A:
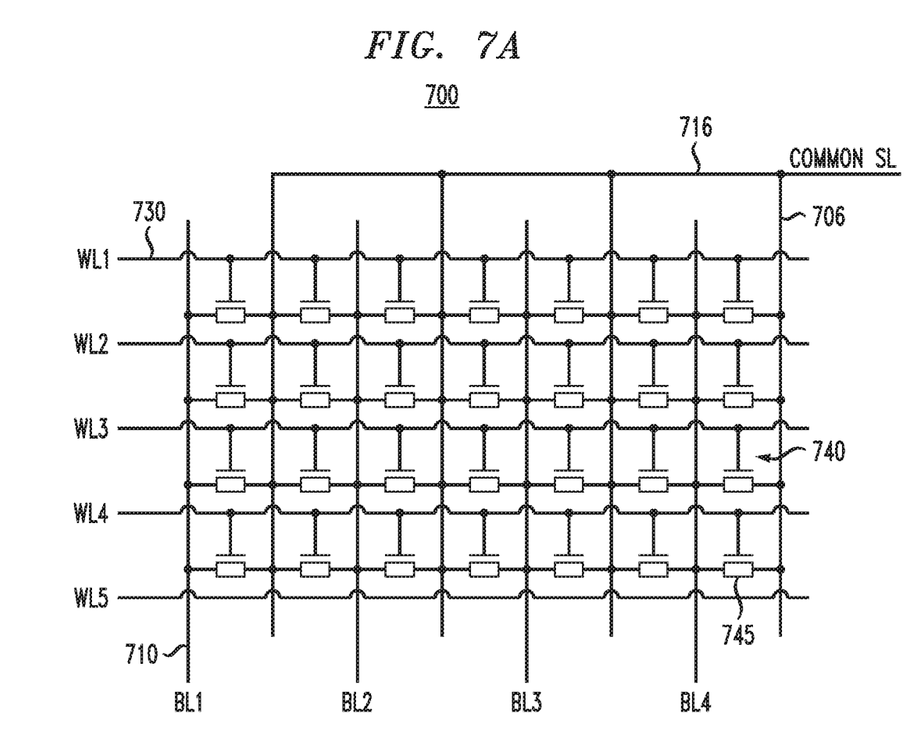
FIGS. 7A and 7B are circuit diagrams of memory cell arrays illustrating memory cells including three-terminal memory elements, according to embodiments of the invention.
Figure 7B:
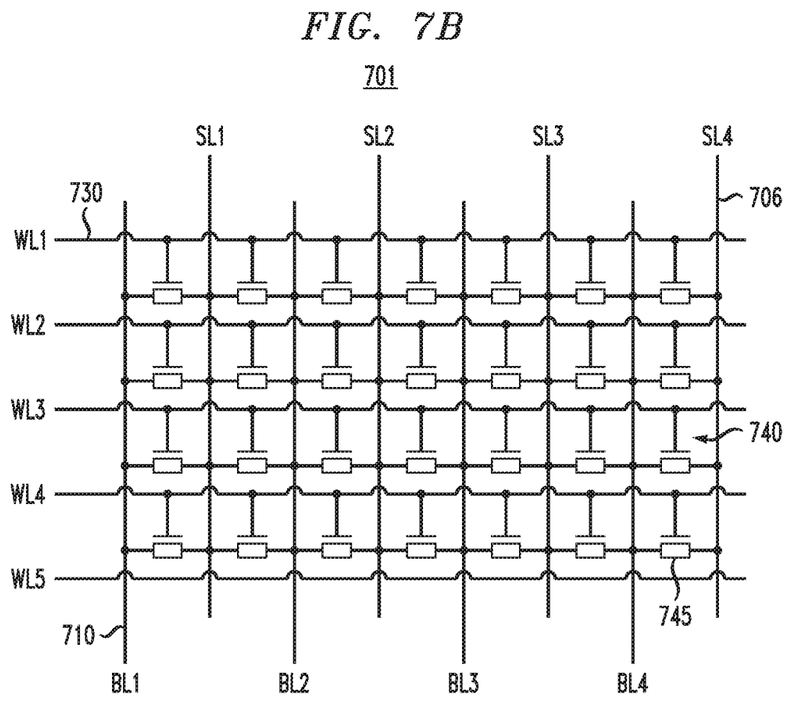

FIGS. 7A and 7B are circuit diagrams 700 and 701 of memory cell arrays illustrating a plurality of memory cells 740, each memory cell 740 including a three-terminal memory element 745 (e.g., a 3T memristor, with a source terminal, a drain terminal and a gate terminal). The circuit diagrams 700 and 701 each show a memory cell array including a plurality of source lines 706, a plurality of drain lines 710 and a plurality of gate lines 730. In FIGS. 7A and 7B, the plurality of drain and gate lines 710 and 730 are respectively bitlines and wordlines, and are respectively labeled (BL1, BL2, BL3, BL4 and WL1, WL2, W3 and W4). In FIG. 7A, the plurality of source lines 706 are connected to a common source 716, and in FIG. 7B, the plurality of source lines 706 (labelled SL1, SL2, SL3, SL4) are not connected to a common source. Although 4 each of the source, drain and gate lines 706, 710 and 730 are illustrated in FIGS. 7A and 7B, the embodiments are not limited thereto, and more or less source, drain and gate lines may be included in a memory cell array. The source, drain and gate lines 706, 710 and 730, and the common source 716 correspond to the source, drain and gate lines 7106, 110 and 130, and the common source 116 described herein above. External circuitry has access to the plurality of the drain lines 710 and the plurality of gate lines 730 in FIGS. 7A and 7B, the common source 716 in FIG. 7A, and the plurality of the source lines 706 in FIG. 7B, to perform write, read, erase, error correction, and/or, in some embodiments, refresh (i.e., read followed by write-back) operations. In one or more embodiments, the external circuitry has the capability to independently apply and/or read a voltage and/or a current to/from each, every, or a portion of the plurality of the lines the external circuitry has access to, and/or independently set each, every or a portion of the lines to a high-impedance (floating) state. A read, write, erase, refresh, and/or error correction operation may be performed on an individual or a plurality (e.g., a row, a column, or a block) of memory cells 740.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
    forming a plurality of source lines spaced apart from each other on a dielectric layer;
    forming a plurality of spacers on sides of the plurality of source lines;
    forming a plurality of drain lines on the dielectric layer adjacent the plurality of source lines including the plurality of spacers formed thereon;
    forming a metal oxide layer on the plurality of source lines and on the plurality of drain lines;
    forming a plurality of gate lines on the metal oxide layer;
    wherein the plurality of gate lines are oriented perpendicular to the plurality of drain lines and the plurality of source lines.

2. The method according to claim 1, wherein the plurality of source lines, the plurality of spacers, the plurality of drain lines, the metal oxide layer and the plurality of gate lines are parts of a memory cell array having a three-dimensional (3D) cross-point structure.

3. The method according to claim 1, wherein the plurality of gate lines are spaced apart from each other on the metal oxide layer.

4. The method according to claim 3, further comprising removing exposed portions of the metal oxide layer between the plurality of gate lines.

5. The method according to claim 1, further comprising forming an additional dielectric layer on the metal oxide layer between the metal oxide layer and the plurality of gate lines.

6. The method according to claim 5, wherein the plurality of gate lines are spaced apart from each other on the additional dielectric layer.

7. The method according to claim 6, further comprising removing exposed portions of the additional dielectric layer between the plurality of gate lines.

8. The method according to claim 6, further comprising removing portions of the metal oxide layer under the exposed portions of the additional dielectric layer between the plurality of gate lines.

9. The method according to claim 1, wherein the metal oxide layer comprises one of strontium titanate ($SrTiO_3$), zirconium titanate (ZrTiO$_3$), PCMO (Pr$_{0.7}$Ca$_{0.3}$MnO$_3$), nickel oxide (NiO), and titanium oxide (TiO$_2$).

10. The method according to claim 1, wherein the plurality of spacers comprise a nitride.

11. The method according to claim 1, wherein the plurality of source lines extend from a common source region.

12. The method according to claim 1, wherein the plurality of source lines, the plurality of spacers, the plurality of drain lines, the metal oxide layer and the plurality of gate lines are parts of a memory cell array comprising a plurality of memory cells, where each memory cell of the plurality of memory cells comprises a three-terminal memristor.

13. The method according to claim 1, wherein the plurality of source lines, the plurality of spacers, the plurality of drain lines, the metal oxide layer and the plurality of gate lines are parts of a memory cell array comprising a plurality of memory cells, where each memory cell of the plurality of memory cells comprises a source terminal, a drain terminal and a gate terminal.

14. The method according to claim 1, wherein respective portions of the metal oxide layer are respective non-volatile conduction regions of a plurality of memory elements in a memory cell array.

15. A method for manufacturing a semiconductor memory device, comprising:
   forming a plurality of select lines spaced apart from each other on an inter-level dielectric (ILD) layer;
   forming a plurality of spacers on sides of the plurality of select lines;
   forming a plurality of bitlines on the ILD layer adjacent the plurality of select lines including the plurality of spacers formed thereon;
   forming a metal oxide layer on the plurality of select lines and on the plurality of bitlines;
   forming a plurality of wordlines on the metal oxide layer;
   wherein the plurality of wordlines are oriented perpendicular to the plurality of bitlines and the plurality of select lines.

16. The method according to claim 15, wherein the plurality of select lines, the plurality of spacers, the plurality of bitlines, the metal oxide layer and the plurality of wordlines are parts of a memory cell array having a three-dimensional (3D) cross-point structure.

* * * * *